(12) United States Patent
Chien et al.

(10) Patent No.: US 6,319,839 B1
(45) Date of Patent: Nov. 20, 2001

(54) APPROACH TO FORM AN INTER-POLYSILICON OXIDE (IPO) LAYER FOR CHARGE COUPLED DEVICES

(75) Inventors: Wen-Cheng Chien, Kaohsiung; Jen-Pan Wang, Tainan, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/412,629

(22) Filed: Oct. 4, 1999

(51) Int. Cl.[7] .................................................. H01L 21/302
(52) U.S. Cl. ..................... 438/704; 438/706; 438/723; 438/724; 438/745; 438/756; 438/757
(58) Field of Search .................... 438/704, 706, 438/723, 724, 745, 756, 757

(56) References Cited

U.S. PATENT DOCUMENTS

| | | | |
|---|---|---|---|
| 5,470,779 | * 11/1995 | Yoo | 437/52 |
| 5,480,814 | * 1/1996 | Wuu et al. | 437/41 |
| 5,796,649 | * 8/1998 | Keum et al. | 365/149 |
| 5,804,488 | * 9/1998 | Shih et al. | 438/396 |
| 5,861,347 | * 1/1999 | Maiti et al. | 438/787 |
| 5,866,449 | * 2/1999 | Liaw et al. | 438/238 |
| 5,960,270 | * 9/1999 | Misra et al. | 438/197 |
| 5,977,600 | * 11/1999 | Wristers et al. | 257/408 |
| 6,162,675 | * 12/2000 | Hwang et al. | 438/241 |
| 6,180,535 | * 1/2001 | Wu et al. | 438/734 |
| 6,251,719 | * 6/2001 | Wang | 438/238 |

OTHER PUBLICATIONS

Chang et al., "ULSI Technology", The McGraw Hill Companies, Inc., New York, New York, (1996), p. 168.*

* cited by examiner

Primary Examiner—Felisa Hiteshew
Assistant Examiner—Charlotte A. Braun
(74) Attorney, Agent, or Firm—George O. Saile; Stephen B. Ackerman

(57) ABSTRACT

A method for forming an IPO between two polysilicon layers that produces an oxide of superior uniformity and eliminates undercutting, stringer formation, fringe electric fields and plasma damage. The method modifies the prior art by using a densified TEOS mask to allow etching away of the substrate oxide and allow the selective etch of a subsequent non-densified TEOS layer. A high temperature thermal oxide (HTO) then covers the resulting formation. The thickness of the second TEOS layer can be controlled to prevent field fringing and the underlying HTO layer prevents undercutting and stringer formation.

22 Claims, 3 Drawing Sheets

APPROACH TO FORM AN INTER-POLYSILICON OXIDE (IPO) LAYER FOR CHARGE COUPLED DEVICES

BACKGROUND OF THE INVENTION

1. Field of the Invention

The present invention is a method of forming an inter-polysilicon oxide (IPO) layer of superior uniformity between two polysilicon layers (POLY1 and POLY2) in a microelectronics fabrication, such as, but not limited to, the fabrication of a charge coupled device (CCD), so that POLY2 does not undercut the IPO, stringer formation does not occur in POLY2, plasma damage is significantly reduced and fringe electric fields during the operation of the device can be controlled.

2. Description of the Related Art

Certain microelectronics devices, such as charge coupled devices (CCD), are formed by a process in which a silicon substrate is first covered by an oxide-nitride-oxide (ONO) layer (see C. Y. Chang and S. M. Sze, "ULSI Technology," McGraw-Hill Book Co., N.Y. 1996, p.168). An initial polysilicon (POLY1) layer or a topographic distribution of such layers is then deposited on this ONO substrate. This POLY1 layer is then covered by a polysilicon oxide layer, called the inter-polysilicon oxide layer (IPO), which is formed by wet thermal oxidation. As a final step in the fabrication, a second polysilicon layer (POLY2) is deposited over the IPO layer, Shih et al., U.S. Pat. No. 5,804,488, applies such a process to the formation of capacitors within the fabrication of microelectronic circuitry. Wuu et al, U.S. Pat. No. 5,480,814, discuss the formation of IPO layers over polysilicon gates in the context of the fabrication of certain self-aligned contact (SAC) structures. Liaw et al., in U.S. Pat. No. 5,866,499 discuss the formation of a triple-layer polysilicon structure separated by IPO layers. Yoo, in U.S. Pat. No. 5,470,779, discusses the formation of an SRAM structure in which an IPO is formed by plasma chemical vapor deposition (PE CVD) between a polysilicon layer and a semi-insulating polycrystalline silicon (SIPOS). The process by which the POLY2 layer is deposited over the IPO layer can cause the IPO layer to be undercut, leading to the formation of POLY2 stringers within the undercut area. In addition to the undercutting and stringer formation, the IPO layer may also be subject to non-uniformities as a result of the method of deposition The present invention provides a method to form IPO layers in such a way as to eliminate the undercutting and stringer formation and increase the uniformity of the IPO.

SUMMARY OF THE INVENTION

A first object of this invention is to provide a method of forming an inter-polysilicon oxide (IPO) layer between two polysilicon layers, POLY1 and POLY2, (the first deposited layer denoted POLY1 and the subsequent deposited layer denoted POLY2) in the fabrication of certain microelectronic devices such as but not limited to a charge coupled device (CCD).

A second object of this invention is to provide a method of forming an IPO layer such that the deposition of POLY2 layer does not undercut the previously deposited IPO layer.

A third object of this invention is to provide a method of forming an IPO layer such that the deposition of POLY2 layer does not produce stringers within the IPO layer as a result of deposition occurring within the undercut area.

A fourth object of this invention is to provide a method of forming an IPO layer such that the deposition of POLY2 layer occurs with a significant reduction of plasma deposition damage.

A fifth object of this invention is to provide a method of forming an IPO layer such that controlled variations of its lateral thickness during formation can be used to control the fringe electric fields produced by the device when in use.

A sixth object of this invention is to provide a method of forming an IPO layer between two polysilicon layers such that said IPO layer is characterized by a higher degree of uniformity than is presently obtainable by other methods.

In accord with the objects of the present invention there is provided a sequence of process steps for depositing a highly uniform IPO layer such that its lateral width can be controlled and such that the deposition of POLY2 layer occurs with no undercutting of the IPO layer, no stringer formation and with a significant reduction of plasma deposition damage.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention is a method for forming an inter-polysilicon oxide (IPO) layer between two polysilicon layers (POLY1 and POLY2) deposited on a certain silicon substrate in a microelectronics fabrication in such a manner that the deposition of POLY2 layer does not undercut the previously deposited IPO layer and produce stringers therein. This invention will be of particular applicability in the fabrication of a charge coupled device (CCD), but it is not limited to such fabrication.

Figure 1:
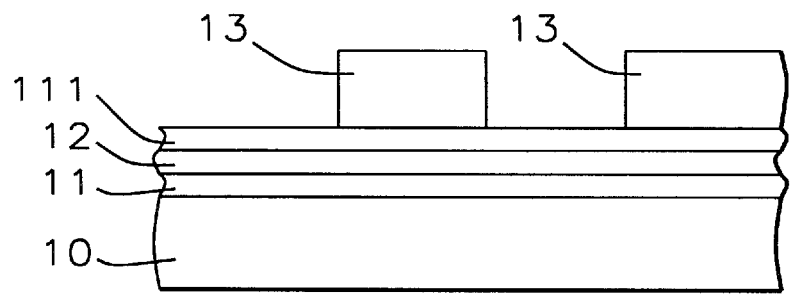
FIG. 1, FIG. 2 and FIG. 3 show a series of schematic cross-sectional diagrams illustrating the results of forming on a certain substrate a pair of devices, each consisting of two polysilicon layers (POLY1 and POLY2) separated vertically by an interpolysilicon oxide (IPO) layer and using a method consistent with the current art but not in accord with the present invention.
Figure 2:
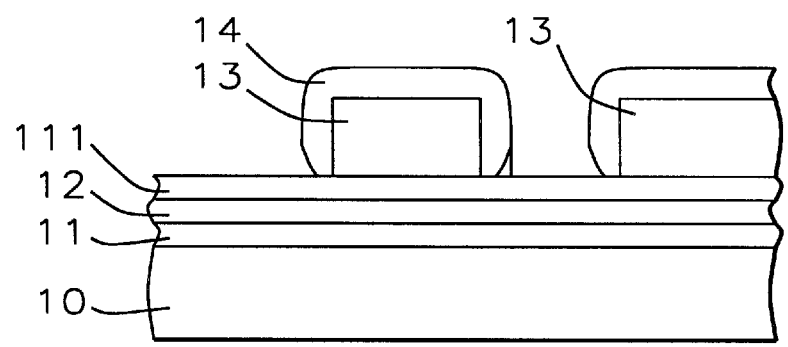
Figure 3:
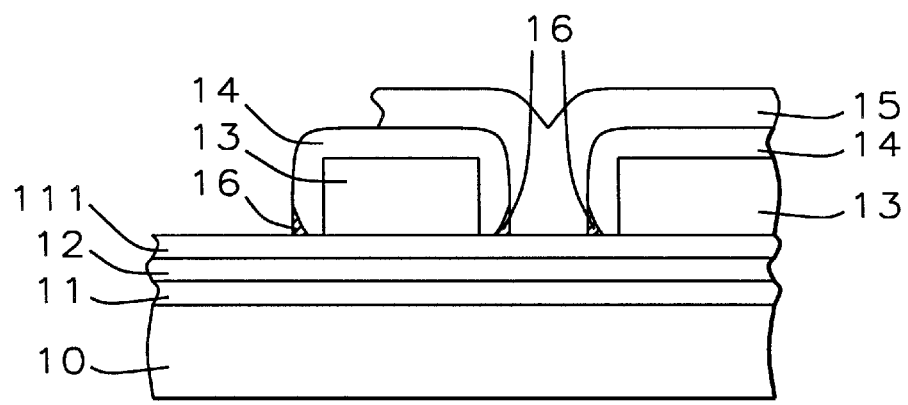

Referring now to FIG. 1, FIG. 2 and FIG. 3, there is shown a series of schematic cross-sectional diagrams illustrating the forming, within a microelectronics fabrication such as the fabrication of a CCD, of an IPO between two layers of polysilicon. FIG. 1 shows a pair of initial polysilicon (POLY1) layers (13) deposited on a silicon substrate (10) on which has previously been deposited an oxide-nitride-oxide (ONO) layer, consisting of two layers of high temperature thermal oxides (HTO) (11) (111), between which has been formed a nitride layer (12). The diagram in FIG. 1 is consistent with the initial processing step of both the method of the prior art and the method of the present invention. FIG. 2 shows the deposition of an IPO (14) over each of said two polysilicon (POLY1) layers (13) using the method of the prior art, wet thermal oxidation, which is not in accord with the method of the present invention. FIG. 3 shows the deposition of the second polysilicon (POLY2) layer (15), now covering both IPO layers (14) and initial polysilicon (POLY1) layers (13). Said deposition is not in accord with the methods of the present invention and leads to the formation by the POLY2 etch of undercut regions in the IPO (16) filled in by stringers of POLY2, which are shown cross-hatched in the diagram for better visualization.

Figure 4:
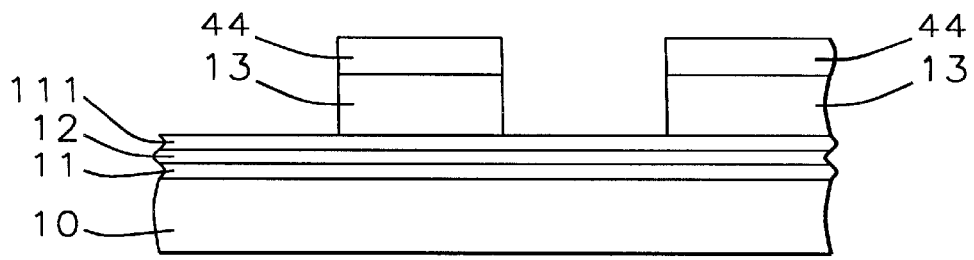
FIG. 4, FIG. 5, FIG. 6, FIG. 7, FIG. 8, FIG. 9 and FIG. 10 show a series of schematic cross-sectional diagrams illustrating the results of forming on a certain substrate, in accord with the preferred embodiment of the present invention, a pair of side-by-side devices, each consisting of two polysilicon layers (POLY1 and POLY2) separated vertically by an inter-polysilicon oxide (IPO) layer.

Referring now to FIG. 4, which represents the process step in the present invention that follows FIG. 1, there is shown the initial pair of polysilicon (POLY1) layers (13) deposited on the ONO layer (11), (12), (111) of the silicon substrate (10). Using the method of the present invention, there has now been deposited on said POLY1 layer, after a dry etch of POLY1, a densified layer of tetraethyl orthosilicate (TEOS) of approximately 3500 angstroms thickness (44), but which could also be deposited to a thickness of between 3000 angstroms and 4000 angstroms. This densified TEOS 1 layer, will serve both as a protective mask and as a first layer of the IPO layer.

Figure 5:
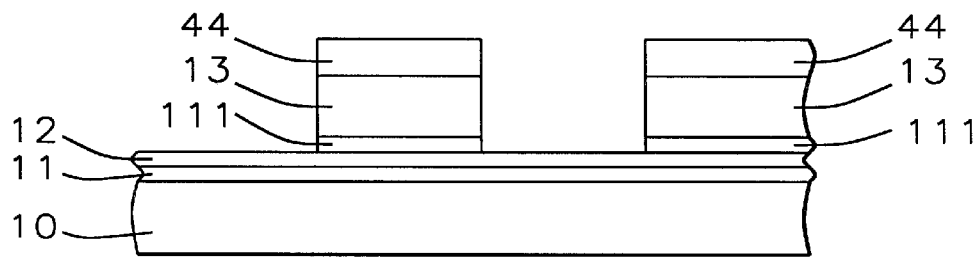
Figure 6:
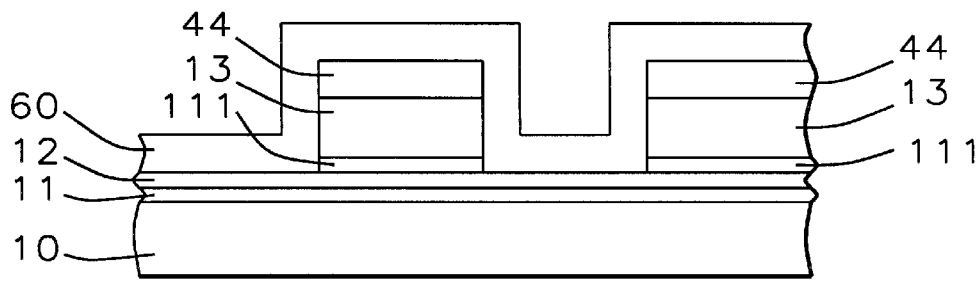

FIG. 5 shows the fabrication of FIG. 4 after having been subjected to a hydrofluoric acid (HF) wet dip of approximately 90 sec. duration. The HF wet dip etches away the top layer of high temperature thermal oxide (HTO) of the ONO substrate layer (111), except where it lies beneath the TEOS1 mask (44) protected POLY1 layer (13). This remaining HTO will serve as a gate oxide for the POLY1. FIG. 6 shows the results of depositing a non-densified TEOS spacer layer (60), TEOS2, of approximately 3500 angstroms thickness, but which could have a range of thicknesses between 2500 angstroms and 4000 angstroms, over the fabrication.

Figure 7:
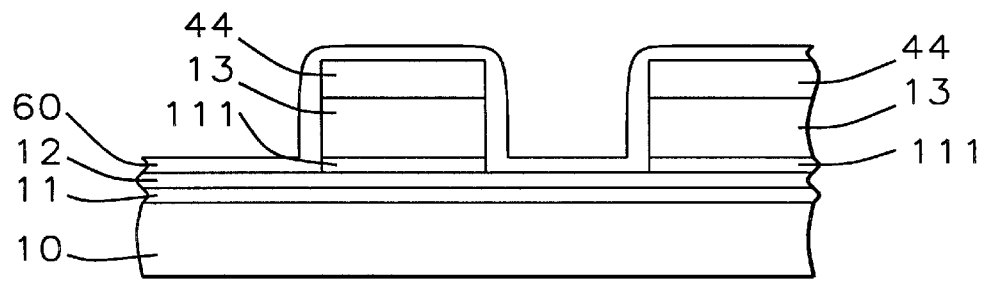
Figure 8:
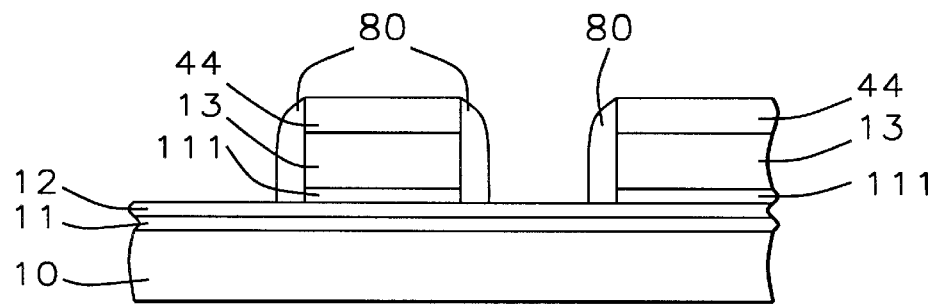
Figure 9:
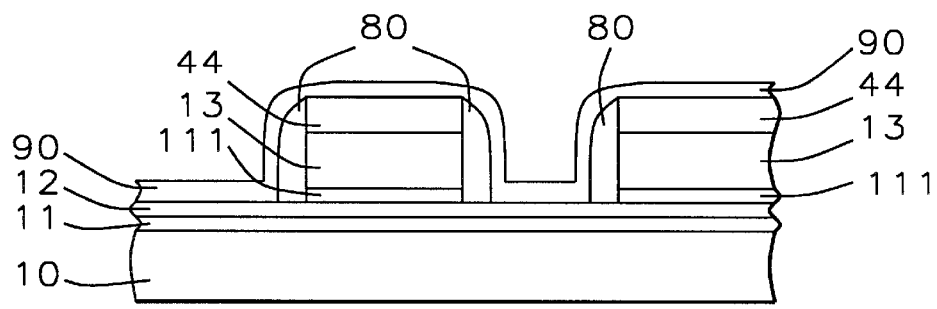

FIG. 7 and FIG. 8 show the results of applying a carefully controlled sequence of dry (FIG. 7) and wet (FIG. 8) etches to the TEOS2 spacer layer. The non-densified TEOS2 spacer layer is selectively etched by the 50:1 HF solution as compared to the densified TEOS1 layer. This selectivity allows the formation of the TEOS2 end-caps (80) whose thickness will allow the fringe electric fields of the fabrication to be controlled. FIG. 9 shows the deposition of a high temperature thermal oxide (HTO) of thickness between 10 angstroms and 110 angstroms over the fabrication (90). The TEOS2 also serves as a spacer for the final HTO, which prevents the undercutting of POLY1 and stringer formation that results in the prior art.

Figure 10:
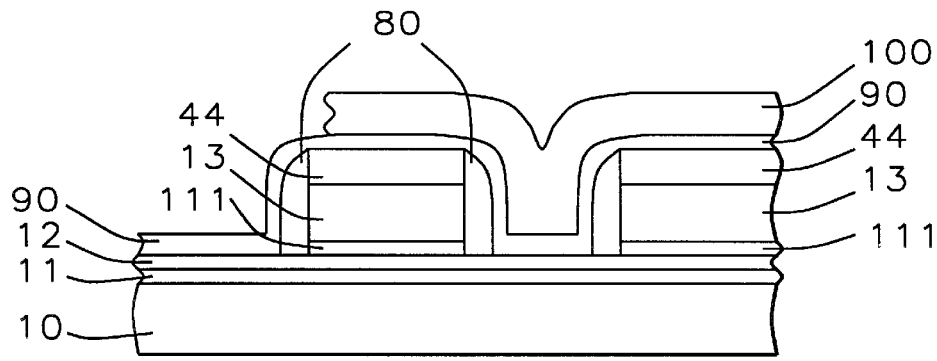

FIG. 10 shows the results of the final polysilicon (POLY2) deposition (100), depicting the lack of any undercutting or stringer formation. The IPO is now the composite structure made up of TEOS1 (44), TEOS2 (80) and the HTO (90).

As is understood by a person skilled in the art, the preferred embodiment and examples of the present invention are illustrative of the present invention rather than limiting of it. Revisions and modifications may be made to structures and dimensions through which is fabricated an inter-polysilicon oxide layer in accord with the preferred embodiment and examples of the present invention while still providing an interpolysilicon oxide layer in accord with the present invention and appended claims.

What is claimed is:

1. A method for forming an inter-polysilicon oxide (IPO) layer between two polysilicon layers (POLY1 and POLY2) deposited on a certain silicon substrate in a microelectronics fabrication in such a manner that the deposition of POLY2 layer does not undercut the previously deposited IPO layer, comprising:

providing a silicon substrate on which has been formed an oxide-nitride-oxide (ONO) layer, by a succession of thermal depositions consisting of a deposited high temperature silicon oxide (HTO) layer over which has been deposited a silicon nitride layer over which has been deposited a high temperature silicon oxide (HTO) layer;

depositing on said substrate a first polysilicon layer (POLY1) or a topographic distribution of such layers;

depositing on said polysilicon layers, using a dry etch, a mask of densified tetraethyl orthosilicate (TEOS);

subjecting said fabrication of TEOS-masked polysilicon layers to a wet dip for removal of the outer thermal oxide (HTO) layer on the silicon substrate;

depositing on said fabrication a non-densified layer of tetraethyl orthosilicate (TEOS);

subjecting said fabrication to a partial dry etch followed by a partial HF wet etch;

depositing on said fabrication a high temperature thermal oxide (HTO) and depositing over said high temperature thermal oxide on said fabrication a second polysilicon layer (POLY2).

2. The method of claim 1 wherein the first HTO layer of the ONO layer is formed to a thickness of between about 90 angstroms and 110 angstroms, the nitride layer is formed to a thickness of between about 150 angstroms and 250 angstroms and the final HTO layer is formed to a thickness of between about 90 angstroms and 110 angstroms.

3. The method of claim 1 wherein said first polysilicon layer (POLY1) is formed to a thickness of between about 2500 angstroms and 3500 angstroms, width between about 0.3 microns and 0.6 microns and spacings of between about 0.4 microns and 0.6 microns.

4. The method of claim 1 wherein said mask of densified TEOS is formed to an approximate thickness of 3500A, but which thickness can be between about 3000 angstroms and 4000 angstroms.

5. The method of claim 1 wherein said wet dip of the TEOS masked polysilicon layers for HTO layer removal is a hydrofluoric acid (HF) wet dip of approximately 90 sec. duration, but which could be of duration between 80 sec. and 100 sec.

6. The method of claim 1 wherein said non-densified TEOS layer is formed to a thickness of between 2500 angstroms and 4000 angstroms.

7. The method of claim 1 wherein said fabrication is subjected to a partial dry etch to retain between 400 angstroms and 800 angstroms of said non-densified TEOS layer.

8. The method of claim 1 wherein said fabrication is subject to a partial HF wet etch of duration between approximately 100 sec. and 150 sec.

9. The method of claim 1 wherein said HTO layer is deposited to a thickness of between approximately 90 angstroms and 110 angstroms.

10. The method of claim 1 wherein said second polysilicon (POLY2) layer is formed to a thickness of between about 2500 angstroms and 4500 angstroms over said HTO layer.

11. The method of claim 1 wherein the microelectronics fabrication is the fabrication of a charge coupled device (CCD).

12. A method for forming an inter-polysilicon oxide (IPO) layer with end-caps whose width can be controlled during fabrication to eliminate electric field fringing in microelectronic devices, comprising:

providing a silicon substrate on which has been formed an oxide-nitride-oxide (ONO) layer, by a succession of thermal depositions consisting of a deposited high temperature silicon oxide (HTO) layer over which has been deposited a silicon nitride layer over which has been deposited a high temperature silicon oxide (HTO) layer;

depositing on said substrate a first polysilicon layer (POLY1) or a topographic distribution of such layers;

depositing on said polysilicon layers, using a dry etch, a mask of densified tetraethyl orthosilicate (TEOS);

subjecting said fabrication of TEOS-masked polysilicon layers to a wet dip for removal of the outer thermal oxide (HTO) layer on the silicon substrate;

depositing on said fabrication a non-densified layer of tetraethyl orthosilicate (TEOS);

subjecting said fabrication to a partial dry etch followed by a partial HF wet etch to remove a portion of said non-densified layer of tetraethyl orthosilicate (TEOS) and form lateral end-caps, wherein the duration of said dry and wet etches allow control of the lateral thickness of the remaining end-cap portion of the layer of non-densified tetraethyl orthosilicate (TEOS);

depositing on said fabrication a high temperature thermal oxide (HTO) and depositing over said high temperature thermal oxide on said fabrication a second polysilicon layer (POLY2).

13. The method of claim 12 wherein the first HTO layer of the ONO layer is formed to a thickness of between about 90 angstroms and 110 angstroms the nitride layer is formed to a thickness of between about 150 angstroms and 250 angstroms and the final HTO layer is formed to a thickness of between about 90 angstroms and 110 angstroms.

14. The method of claim 12 wherein wherein said first polysilicon layer (POLY1) is formed to a thickness of between about 2500 angstroms and 3500 angstroms, width between about 0.3 microns and 0.6 microns and spacings of between about 0.4 microns and 0.6 microns.

15. The method of claim 12 wherein said mask of densified TEOS is formed to an approximate thickness of 3500A, but which thickness can be between about 3000 angstroms and 4000 angstroms.

16. The method of claim 12 wherein said wet dip of the TEOS masked polysilicon layers for HTO layer removal is a hydrofluoric acid (HF) wet dip of approximately 90 sec. duration, but which could be of duration between 80 sec. and 100 sec.

17. The method of claim 12 wherein said non-densified TEOS layer is formed to a thickness of between 2500 angstroms and 4000 angstroms.

18. The method of claim 12 wherein said fabrication is subjected to a partial dry etch that leaves between about 400 angstroms and 800 angstroms of the TEOS layer remaining.

19. The method of claim 12 wherein said fabrication is subject to a partial HF wet etch of duration between approximately 100 sec. and 150 sec.

20. The method of claim 12 wherein said HTO layer is deposited to a thickness of between approximately 90 angstroms and 110 angstroms.

21. The method of claim 12 wherein said second polysilicon (POLY2) layer is formed to a thickness of between about 2500 angstroms and 4500 angstroms over said HTO layer.

22. The method of claim 12 where said IPO is used in the construction of a charge coupled device (CCD).

\* \* \* \* \*